(12) United States Patent
Liao et al.

(10) Patent No.: US 8,232,554 B2
(45) Date of Patent: Jul. 31, 2012

(54) TRANSISTOR ARRAY SUBSTRATE

(75) Inventors: Dian-Gan Liao, Keelung (TW);
Yi-Cheng Tsai, Taoyuan County (TW)

(73) Assignee: Chunghwa Picture Tubes, Ltd.,
Taoyuan (TW)

( * ) Notice: Subject to any disclaimer, the term of this patent is extended or adjusted under 35 U.S.C. 154(b) by 0 days.

(21) Appl. No.: 13/043,112

(22) Filed: Mar. 8, 2011

(65) Prior Publication Data
US 2012/0104419 A1 May 3, 2012

(30) Foreign Application Priority Data

Oct. 29, 2010 (TW) .............................. 99220983 U

(51) Int. Cl.
*H01L 29/04* (2006.01)
(52) U.S. Cl. ................. 257/59; 257/84; 257/88; 257/99
(58) Field of Classification Search .................... 257/59, 257/84, 88, 99
See application file for complete search history.

(56) References Cited

U.S. PATENT DOCUMENTS

| | | |
|---|---|---|
| 6,690,347 B2 | 2/2004 | Jeon et al. |
| 7,369,111 B2 | 5/2008 | Jeon et al. |
| 2006/0228821 A1* | 10/2006 | Hong et al. ..................... 438/30 |
| 2009/0244420 A1 | 10/2009 | Chung et al. |

FOREIGN PATENT DOCUMENTS

JP 10-339863 12/1998
* cited by examiner

*Primary Examiner* — Long Pham
(74) *Attorney, Agent, or Firm* — Muncy, Geissler, Olds & Lowe, PLLC

(57) ABSTRACT

A transistor array substrate includes a substrate, plural pads, plural shorting bars, at least one pixel array, plural first wires, and plural second wires. The substrate has at least one panel region and a peripheral circuit region surrounding the panel region. The pads and the shorting bars are disposed in the peripheral circuit region. The pixel array, the first wires, and the second wires are disposed in the panel region. The panel region has a pair of first edges and a pair of second edges. The first edges are connected between the second edges. The shorting bars are connected to the pads. The first wires and the second wires are electrically connected to the pixel array. The first wires are connected to some shorting bars through one of the first edges. The second wires are connected to the other shorting bars through at least one second edge.

9 Claims, 5 Drawing Sheets

TRANSISTOR ARRAY SUBSTRATE

CROSS-REFERENCE TO RELATED APPLICATION

This application claims the benefit of Taiwan Patent Application No. 099220983, filed on Oct. 29, 2010, which is hereby incorporated by reference for all purposes as if fully set forth herein.

BACKGROUND OF THE INVENTION

1. Field of Invention

The present invention relates to a liquid crystal display (LCD) panel, and particularly to a transistor array substrate applied to an LCD panel.

2. Related Art

In a fabrication process for an existing thin film transistor LCD (TFT-LCD), a transistor array substrate is tested after completed, especially for a pixel array of the transistor array substrate, to determine whether the transistor array substrate works normally.

The current transistor array substrate is generally tested by a plurality of shorting bars. FIG. 1 is a schematic top view of a conventional transistor array substrate. Referring to FIG. 1, The conventional transistor array substrate 100 includes a substrate 110, a plurality of pixel arrays 120, a plurality of shorting bars 130, and a plurality of pads 140, in which the pixel arrays 120, the shorting bars 130, and the pads 140 are all disposed on the substrate 110.

Specifically, the substrate 110 has a plurality of panel regions 112 and a peripheral circuit region 114 surrounding the panel regions 112. The pixel arrays 120 are respectively disposed in the panel regions 112, and the shorting bars 130 and the pads 140 are all disposed in the peripheral circuit region 114.

The pixel arrays 120 are generally electrically connected to the shorting bars 130 through a plurality of wires (not shown) in the panel regions 112, and the shorting bars 130 are connected to the pads 140. Therefore, the pixel arrays 120 are electrically connected to the pads 140 through the shorting bars 130, so that a testing machine can test the pixel arrays 120 through the pads 140. In addition, after testing, the substrate 110 is cut, thereby separating the panel regions 112 from the peripheral circuit region 114, and the normally working pixel array 120 combines with a color filter substrate. Thus, a plurality of LCD panels is completed.

It should be noted that about the disposition of the shorting bars 130, most of the shorting bars 130 are densely distributed in a region Z1 between two adjacent panel regions 112 as shown in FIG. 1, and thus a distance D1 between the two adjacent panel regions 112 is hard to be shortened, so that the utility rate of the substrate 110 is difficult to be increased.

SUMMARY OF THE INVENTION

The present invention is directed to a transistor array substrate to increase the utility rate of the substrate.

The present invention provides a transistor array substrate including a substrate, a plurality of pads, a plurality of shorting bars, at least one pixel array, a plurality of first wires, and a plurality of second wires. The substrate has at least one panel region and a peripheral circuit region surrounding the panel region, wherein the panel region has a pair of first edges and a pair of second edges. The first edges are connected between the second edges. The pads are disposed in the peripheral circuit region. The shorting bars is disposed in the peripheral circuit region and connected to the pads. The pixel array is disposed in the panel region. The first wires are disposed in the panel region and electrically connected to the pixel array, wherein the first wires are connected to a part of the shorting bars through one of the first edges. The second wires are disposed in the panel region and electrically connected to the pixel array, wherein the second wires are connected to the other shorting bars through at least one second edge.

Based on the above, the first wires and the second wires are connected to the shorting bars through the first edge and the second edge of the panel region, and thus the shorting bars do not need to be densely distributed in a region between two adjacent panel regions. Therefore, the present invention enables a distance between the two adjacent panel regions to be shortened and to increase the utility rate of the substrate.

In order to make the above features and advantages of the present invention clearer, preferred embodiments are described in detail below with reference to the accompanying drawings.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

Figure 1:
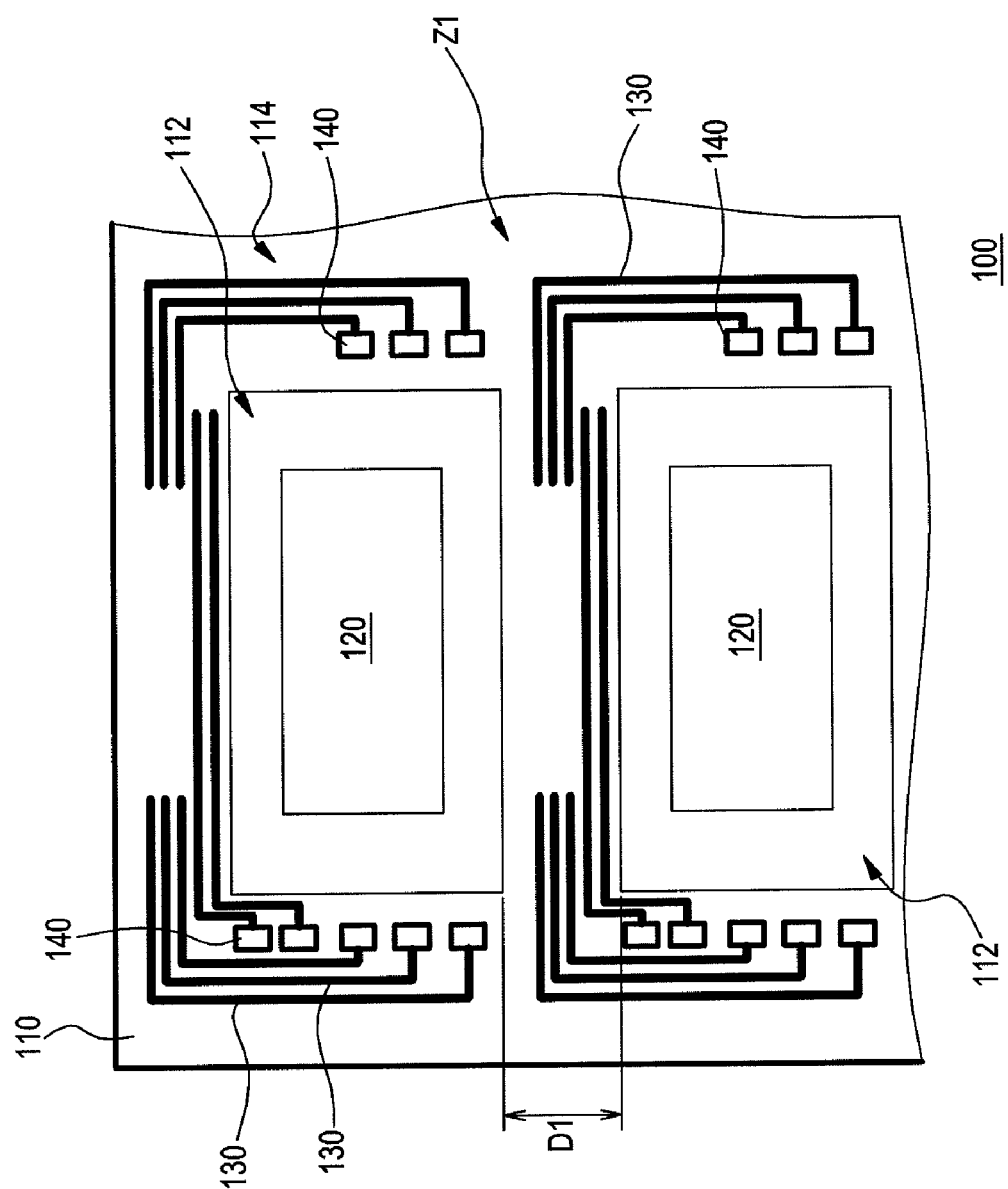
FIG. 1 is a schematic top view of a conventional transistor array substrate.
Figure 2:
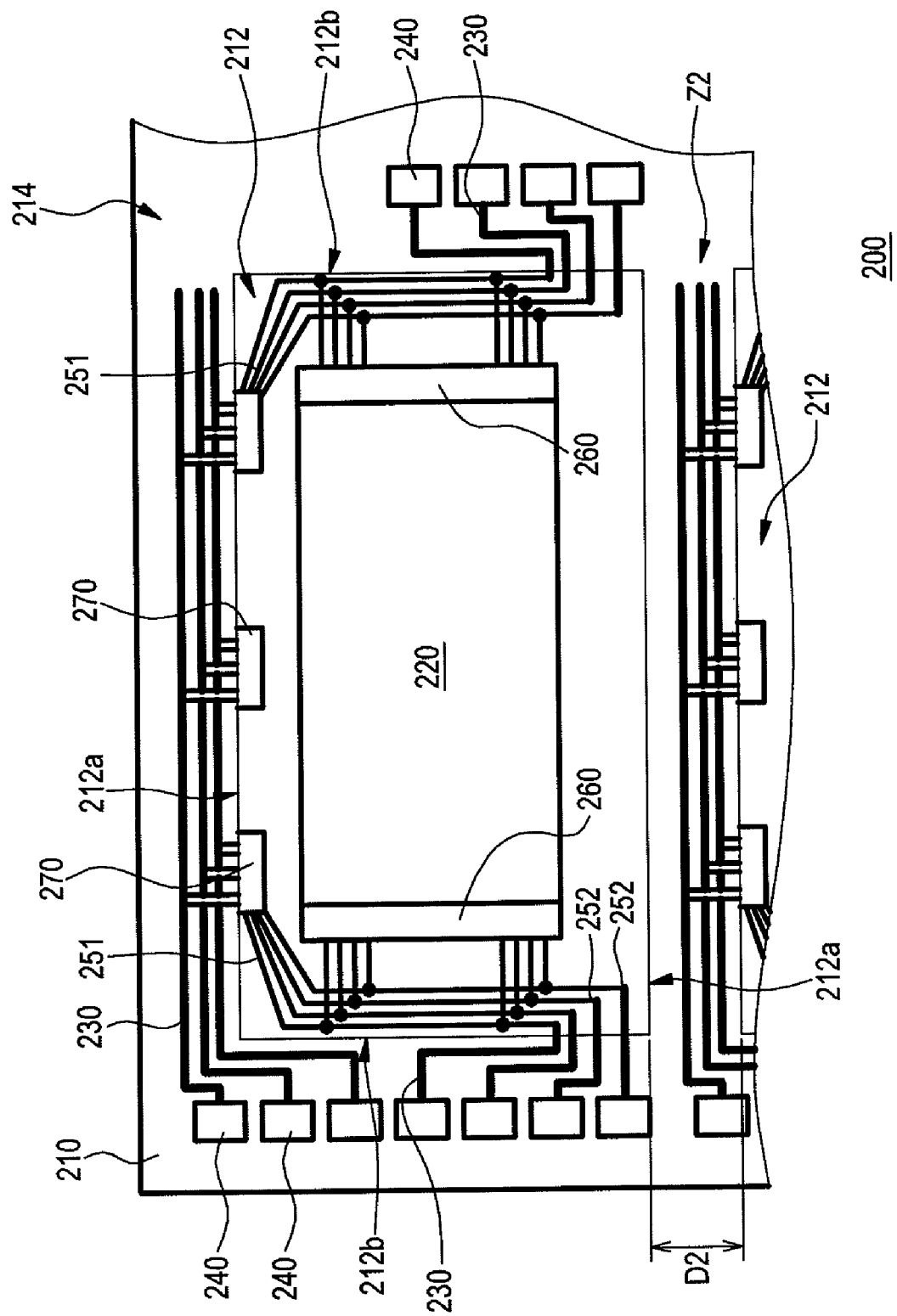
FIG. 2 is a schematic top view of a transistor array substrate according to an embodiment of the present invention.

FIG. 2 is a schematic top view of a transistor array substrate according to an embodiment of the present invention. Referring to FIG. 2, the transistor array substrate 200 of this embodiment includes a substrate 210, at least one pixel array 220, a plurality of shorting bars 230, a plurality of pads 240, a plurality of first wires 251, and a plurality of second wires 252, in which the substrate 210 has at least one panel region 212 and a peripheral circuit region 214. In FIG. 2, the substrate 210 has a plurality of panel regions 212.

Each panel region 212 has a pair of first edges 212a and a pair of second edges 212b. The first edges 212a are connected between the second edges 212b and may be equal to or longer than the second edges 212b. The peripheral circuit region 214 surrounds the panel regions 212. In detail, in the substrate 210, a region except for the panel regions 212 is the peripheral circuit region 214.

The pads 240 and the shorting bars 230 are all disposed in the peripheral circuit region 214. The first wires 251, the second wires 252, and the pixel array 220 are all disposed in the panel region 212, and thus the pads 240 and the shorting bars 230 are located around a single panel region 212. In addition, the panel regions 212 may be located between the pads 240. In detail, in the surrounding of a single panel region 212, some pads 240 are located beside one of the second edges 212b, and the other pads 240 are located beside the other second edge 212b, as shown in FIG. 2.

The shorting bars 230 are connected to the pads 240, and the number of the pads 240 connected to each shorting bar 230 may be one. That is to say, the shorting bars 230 are connected to the pads 240 one by one. The first wires 251 and the second wires 252 are electrically connected to the pixel array 220. The first wires 251 are connected to a part of the shorting bars 230 through one of the first edges 212a, and the second wires 252 are connected to the other shorting bars 230 through the second edges 212b. In addition, the second wires 252 may also be connected to the shorting bars 230 one by one.

The first wires 251 and the second wires 252 are electrically connected to the pixel array 220, and the shorting bars 230 are connected to the pads 240, the first wires 251, and the second wires 252, so that the pads 240 can be electrically connected to the pixel array 220 through the shorting bars 230, the first wires 251, and the second wires 252. Therefore, it can be known that a testing machine (not shown) can test the pixel array 220 through the pads 240.

Moreover, in the same panel region 212, because the first wires 251 and the second wires 252 are connected to the shorting bars 230 respectively through the first edges 212a and the second edges 212b, the shorting bars 230 do not need to be densely distributed in a region Z2 between two adjacent panel regions 212, thereby shortening a distance D2 between the two adjacent panel regions 212 and then increasing the utility rate of the substrate 210.

The transistor array substrate 200 may further include two gate-in-panel (GIP) stages 260. The GIP stages 260 are disposed in the panel region 212 and connected to the pixel array 220, the first wires 251, and the second wires 252. The GIP stages 260 can drive a plurality of gate lines (not shown, and referred to as scan lines) in the pixel array 220. Each second wire 252 is connected to one of the GIP stages 260, and each GIP stage 260 may be located between the pixel array 220 and one of the second edges 212b. In addition, the second wires 252 may be a plurality of gate signal lines.

Furthermore, the transistor array substrate 200 may further include a plurality of source controllers 270. For example, the source controllers 270 are source chips or source integrated circuits (ICs). The source controllers 270 are disposed in the panel region 212 and connected to the first wires 251. Moreover, the source controllers 270 may be located between the pixel array 220 and one of the first edges 212a.

Figure 3:
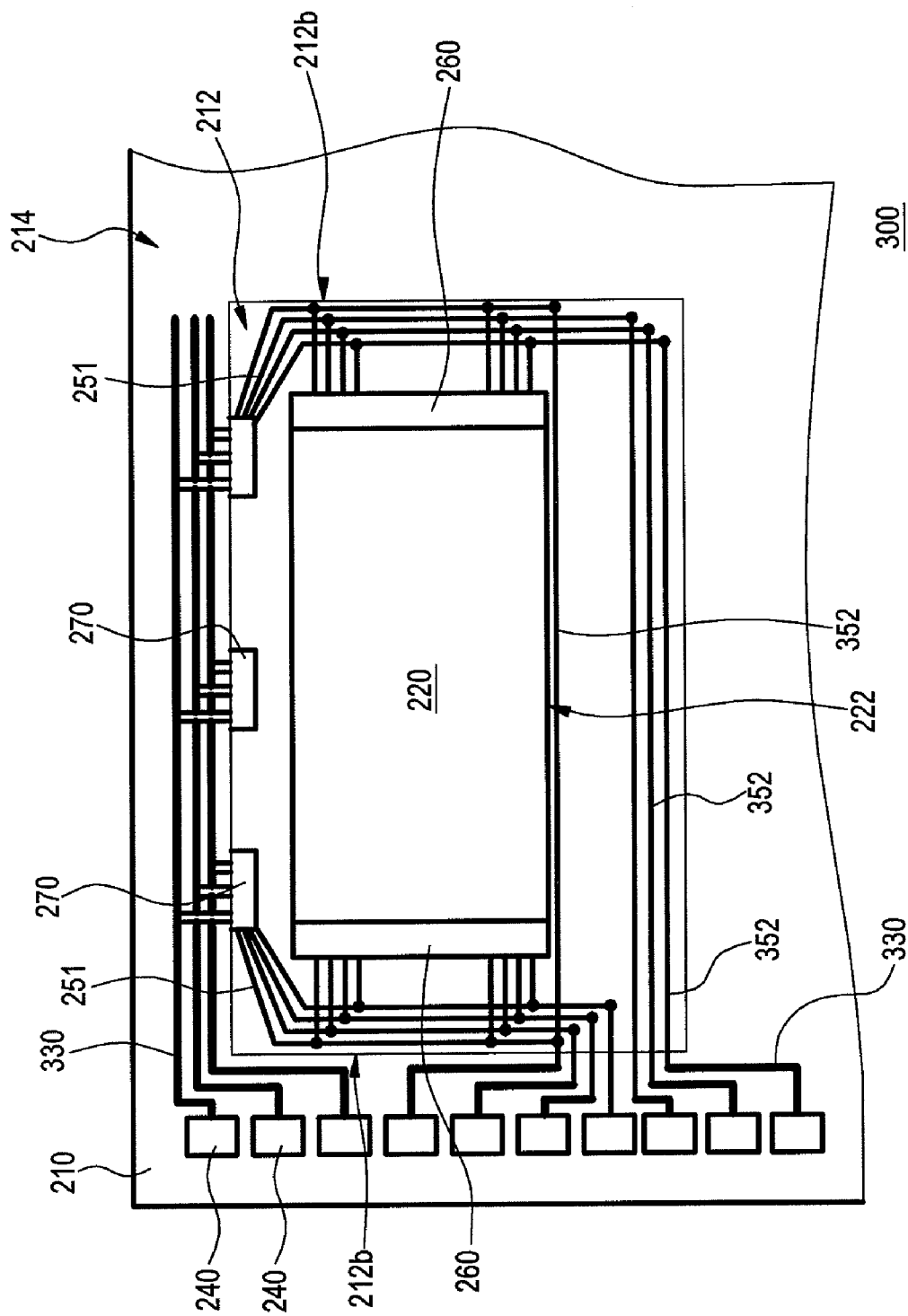
FIG. 3 is a schematic top view of a transistor array substrate according to another embodiment of the present invention.

FIG. 3 is a schematic top view of a transistor array substrate according to another embodiment of the present invention. Referring to FIG. 3, the transistor array substrate 300 of this embodiment includes a substrate 210, at least one pixel array 220, a plurality of shorting bars 330, a plurality of pads 240, a plurality of first wires 251, a plurality of second wires 352, two GIP stages 260, and a plurality of source controllers 270, in which the pixel array 220, the first wires 251, the second wires 352, the GIP stages 260, and the source controllers 270 are all disposed in the panel region 212, and the shorting bars 330 and the pads 240 are disposed in the peripheral circuit region 214.

The transistor array substrate 300 is similar to the above transistor array substrate 200, so that the same features of the two substrates 200, 300 are not mentioned repeatedly, and only the difference between two substrates 200, 300 will be described below. In detail, it is different from the transistor array substrate 200 that the pads 240 are all located beside one of the second edges 212b. In other words, the pads 240 are located at only one side of the panel region 212, as shown in FIG. 3.

Thus, it enables a distance between the second edges 212b of two adjacent panel regions 212 to be shortened, thereby increasing the utility rate of the substrate 210. Besides, the pads 240 are all located beside one of the second edges 212b, so that a testing machine can perform testing conveniently and quickly, and the number of probe bars in the testing machine is further reduced.

In addition, in this embodiment, one of the second wires 352 is connected to the GIP stages 260. Taking the FIG. 3 as an example, among the second wires 352 below the pixel array 220, one of the second wires 352 closest to a lower edge 222 of the pixel array 220 is connected to the GIP stages 260, and the second wire 352 may be further electrically connected to two ends of the scan lines in the pixel array 220. Therefore, the second wire 352 may input gate signals to the pixel array 220 through the two ends of the scan lines and may turn off a plurality of transistors (for example, TFTs) in the pixel array 220.

Moreover, compared with the embodiment as shown in FIG. 2, there is one of the second wires 352 connected to the GIP stages 260 in this embodiment, and the second wire 352 is connected to only one of the pads 240. Thus, the number of the pads 240 in FIG. 3 is less than the number of the pads 240 in FIG. 2. Thus, it can be seen that this embodiment reduces the number of the pads 240, thereby reducing an area occupied by the pads 240 on the substrate 210 and increasing the utility rate of the substrate 210.

Figure 4:
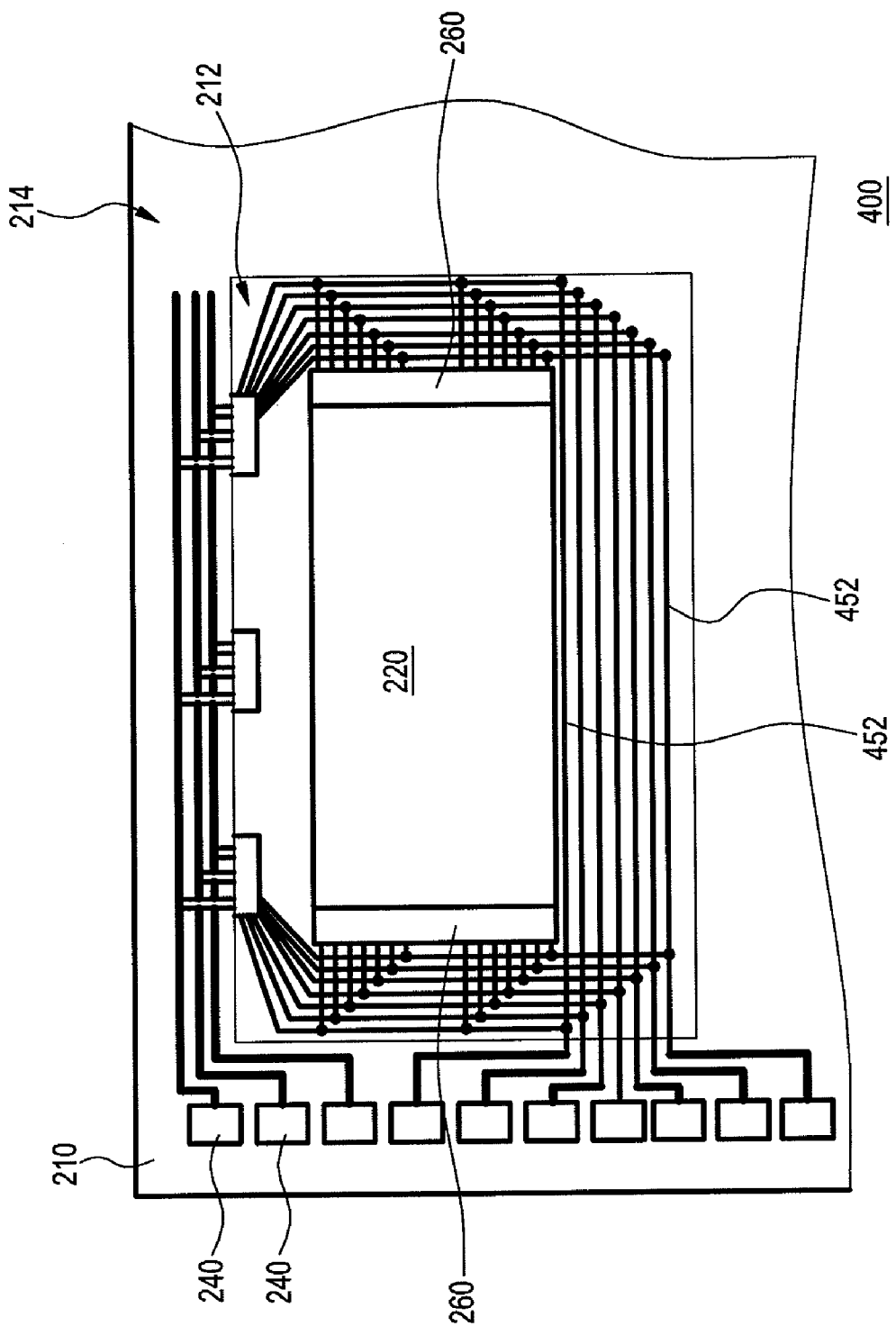
FIG. 4 is a schematic top view of a transistor array substrate according to another embodiment of the present invention.

FIG. 4 is a schematic top view of a transistor array substrate according to another embodiment of the present invention. Referring to FIG. 4, the transistor array substrate 400 of this embodiment is similar to the above transistor array substrate 300. The same features between the two substrates 300 and 400, for example, the same elements included by the two substrates 300, 400 or the same elements disposition, are not mentioned repeatedly, and only the difference between two substrates 300, 400 will be described below.

The difference between the transistor array substrates 300 and 400 lies in that: the transistor array substrate 400 includes a plurality of second wires 452, and each second wire 452 is connected to the GIP stages 260 and is electrically connected to two ends of a plurality of scan lines, so that the second wires 452 can input gate signals through the two ends of the scan lines each to control the transistors in the pixel array 220.

Figure 5:
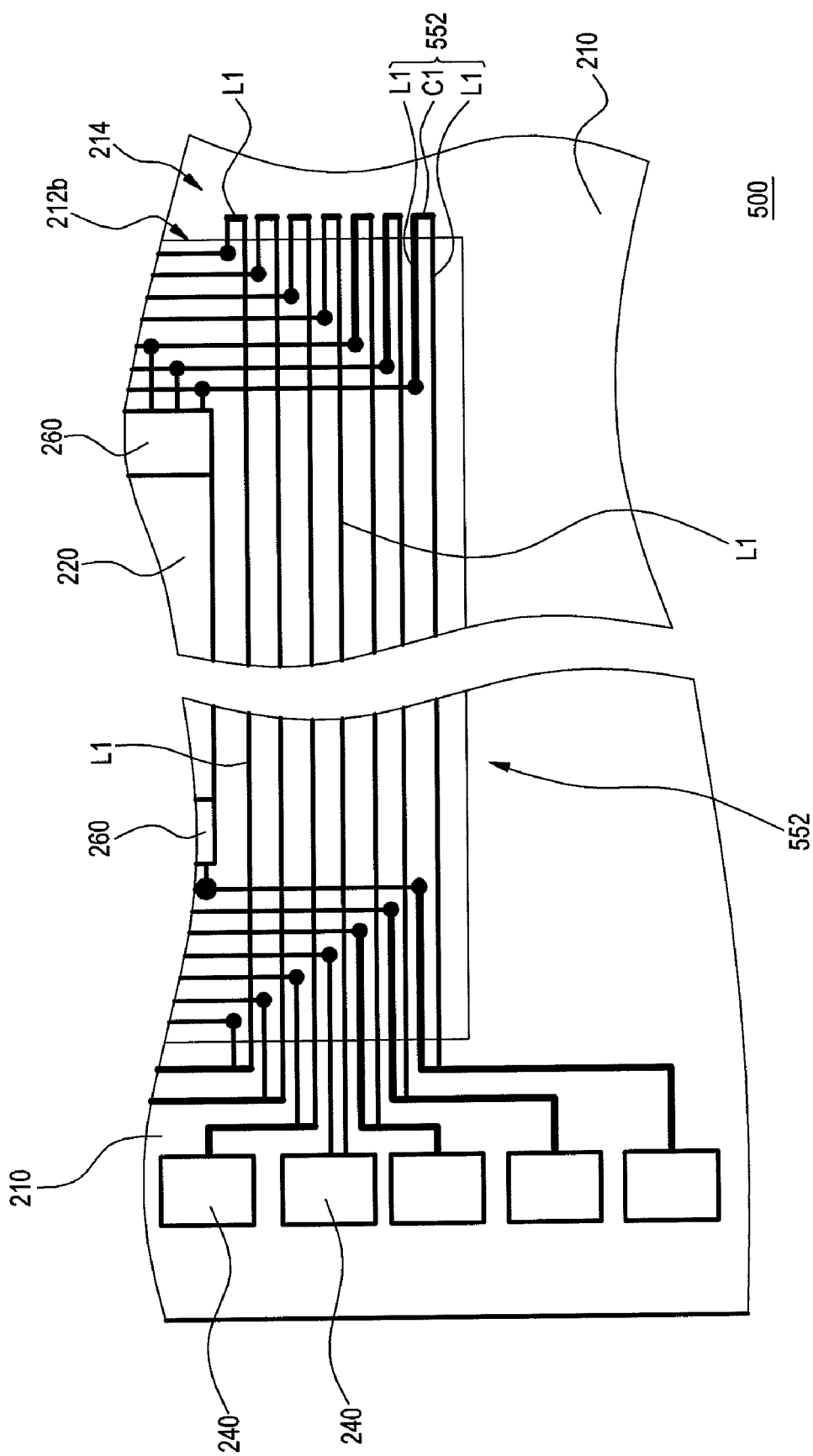
FIG. 5 is a schematic top view of a transistor array substrate according to another embodiment of the present invention.

FIG. 5 is a schematic top view of a transistor array substrate according to another embodiment of the present invention. Referring to FIG. 5, since the transistor array substrate 500 of this embodiment is quite similar to the above transistor array substrate 400, FIG. 5 mainly shows features of the transistor array substrate 500 different from the transistor array substrate 400 structurally and omits drawing some identical structures of the transistor array substrates 400 and 500 in order to make the drawing clear and concise. In addition, in order to make the content of the present invention concise, only the difference between the transistor array substrates 400 and 500 will be described below, and the same features of the two substrates 400 and 500 are not mentioned repeatedly.

About the difference between the transistor array substrates 400 and 500, the transistor array substrate 500 includes a plurality of second wires 552, and each second wire 552 includes a plurality of line sections L1 and a loop section C1. Each loop section C1 is connected to two line sections L1 and located in a peripheral circuit region 214. The loop sections C1 protrude from one of the second edges 212b, as shown in FIG. 5.

After testing the transistor array substrate 500, the substrate 210 is cut, to separate the panel regions 212 from the peripheral circuit region 214. In a cutting process, the loop sections C1 are separated from the line sections L1, so that the line sections L1 of one original second wire 552 are electrically insulated from each other. Thus, some segment parts L1 are set floating. In this manner, the power consumption in the operation of the pixel array 220 is reduced to achieve the power saving effect.

To sum up, in the transistor array substrate of the present invention, the first wires and the second wires are all connected to the shorting bars through the first edge and the second edge of the panel region, and thus the shorting bars do not need to be densely distributed in a region between two adjacent panel regions. Therefore, the present invention enables a distance between the two adjacent panel regions to be shortened, thereby increasing the utility rate of the substrate, so that more LCD panels can be fabricated with one substrate. Accordingly, the substrate can be fully utilized, and the fabrication cost of the LCD panel can be reduced.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A transistor array substrate, comprising:
   a substrate, having at least one panel region and a peripheral circuit region surrounding the panel region, wherein the panel region has a pair of first edges and a pair of second edges, and the first edges are connected between the second edges;
   a plurality of pads, disposed in the peripheral circuit region;
   a plurality of shorting bars, disposed in the peripheral circuit region, and connected to the pads;
   at least one pixel array, disposed in the panel region;
   a plurality of first wires, disposed in the panel region, and electrically connected to the pixel array, wherein the first wires are connected to a part of the shorting bars through one first edge;
   a plurality of second wires, disposed in the panel region, and electrically connected to the pixel array, wherein the second wires are connected to the other shorting bars through at least one second edge; and
   a plurality of source controllers disposed in the panel region and connected to the first wires, wherein the source controllers are located between the pixel array and one of the first edges.

2. The transistor array substrate according to claim 1, wherein the panel region is located between the pads.

3. The transistor array substrate according to claim 1, wherein the pads are located beside one of the second edges.

4. The transistor array substrate according to claim 1, wherein each of the second wires is connected to one of the shorting bars.

5. The transistor array substrate according to claim 1, further comprising two GIP stages disposed in the panel region and connected to the pixel array, the first wires, and the second wires, wherein each of the GIP stages is located between the pixel array and one of the second edges, and the second wires are a plurality of gate signal lines.

6. The transistor array substrate according to claim 5, wherein each of the second wires is connected to one of the GIP stages.

7. The transistor array substrate according to claim 5, wherein one of the second wires is connected to the GIP stages.

8. The transistor array substrate according to claim 7, wherein each of the second wires is connected to the GIP stages.

9. The transistor array substrate according to claim 8, wherein each of the second wires comprises a plurality of line sections and a loop section, each of the loop sections is connected to two of the line sections, the loop sections and the line sections are both located in the peripheral circuit region, and the loop sections protrude from one of the second edges.

* * * * *